United States Patent
Zheng et al.

(10) Patent No.: US 8,709,582 B2
(45) Date of Patent: Apr. 29, 2014

(54) OPTICAL ARTICLE INCLUDING AN ANTIREFLECTING COATING HAVING ANTIFOG PROPERTIES AND PROCESS FOR MAKING SAME

(75) Inventors: Haipeng Zheng, Pinellas Park, FL (US); Michael Rubner, Westford, MA (US); Nuerxiati Nueraji, Brooklyn, NY (US); Robert E. Cohen, Jamaica Plain, MA (US)

(73) Assignee: Essilor International, Charenton le Pont (FR)

( * ) Notice: Subject to any disclaimer, the term of this patent is extended or adjusted under 35 U.S.C. 154(b) by 516 days.

(21) Appl. No.: 12/847,810

(22) Filed: Jul. 30, 2010

(65) Prior Publication Data
US 2012/0028005 A1 Feb. 2, 2012

(51) Int. Cl.
B32B 7/02 (2006.01)
B05D 5/06 (2006.01)
G02B 1/11 (2006.01)
B05D 1/38 (2006.01)
C23C 16/22 (2006.01)

(52) U.S. Cl.
USPC ........... 428/216; 428/220; 428/323; 428/331; 428/507; 428/515; 428/532; 428/533; 428/699; 359/586; 427/162; 427/384; 427/419.3; 427/255.7

(58) Field of Classification Search
USPC ......... 428/212–220, 500, 507–508, 515, 523, 428/532–534, 536, 323–328, 331, 699; 359/580–582, 586, 588–589; 427/162, 427/384, 419.3, 255.7
See application file for complete search history.

(56) References Cited

U.S. PATENT DOCUMENTS

| | | | |
|---|---|---|---|
| 5,753,373 A | 5/1998 | Scholz et al. | 428/429 |
| 5,873,931 A | 2/1999 | Scholz et al. | 100/13 |
| 5,997,621 A | 12/1999 | Scholz et al. | 106/13 |
| 6,391,400 B1 * | 5/2002 | Russell et al. | 428/34 |
| 6,958,172 B2 | 10/2005 | Shirakawa et al. | 427/166 |
| 7,153,584 B2 | 12/2006 | Shirakawa et al. | 428/448 |
| 2006/0177638 A1 * | 8/2006 | Shibuya et al. | 428/212 |
| 2007/0014922 A1 | 1/2007 | Matrossov et al. | 427/294 |
| 2008/0038458 A1 | 2/2008 | Gemici et al. | 427/180 |
| 2009/0324910 A1 | 12/2009 | Gemici et al. | 428/212 |
| 2010/0304150 A1 | 12/2010 | Zheng et al. | 428/414 |
| 2010/0304163 A1 * | 12/2010 | Nueraji et al. | 428/474.4 |

FOREIGN PATENT DOCUMENTS

| | | |
|---|---|---|
| WO | WO 1996/041215 | 12/1996 |
| WO | WO 2007/056427 | 5/2007 |
| WO | WO 2007/098843 | 9/2007 |
| WO | WO 2008/021817 | 2/2008 |

OTHER PUBLICATIONS

Ludox(R) HS-40 Product Information Sheet. Grace Davison, (2010); pp. 1-2.*

Kobler et al. "Colloidal Suspensions of Functionalized Mesoporous Silica Nanoparticles". ACS Nano, vol. 2, No. 4, (2008); pp. 791-799.*

PCT International Search Report and Written Opinion issued in International application No. PCT/EP2011/062981, dated Sep. 29, 2011.

* cited by examiner

Primary Examiner — Prashant J Khatri
(74) Attorney, Agent, or Firm — Fulbright & Jaworski LLP

(57) ABSTRACT

An optical article comprising a substrate and on at least one face of the substrate a multilayered antireflecting coating functioning in an interferential manner having antifog properties, said antireflecting coating including a last layer with a refractive index n≤1.55 and a physical thickness of 120 nm or less directly deposited on a high refractive index layer (HI layer) having a refractive index n>1.55, and a thickness of less than 500 nm.

31 Claims, 4 Drawing Sheets

OPTICAL ARTICLE INCLUDING AN ANTIREFLECTING COATING HAVING ANTIFOG PROPERTIES AND PROCESS FOR MAKING SAME

BACKGROUND OF THE INVENTION

1. Field of the Invention

The invention relates to an optical article including a multilayered antireflecting coating wherein the last layer of the multilayered antireflecting coating has antifog properties.

The invention is based on the use of a layer-by-layer (LbL) coating to form the outermost layer of a multilayered antireflecting coating, said LbL coating comprising a superabsorbent polymer and being crosslinked to get a defined refractive index range.

2. Description of Related Art

It has always been difficult in the past to obtain coatings having at the same time good antifog properties and good antireflective properties.

U.S. Pat. Nos. 5,753,373, 5,873,931 and 5,997,621 disclose single antifog antireflection coatings made through sol-gel process of different surfactants, colloidal silica and crosslinking agent. However, such dip coated thin monolayer can hardly lead to a uniform antireflective (AR) function over an entire substrate and the antireflective performance is then limited to a quarter wave layer, with relatively high reflection level and low control of the residual color.

U.S. Pat. Nos. 6,958,172 and 7,153,584 disclose antifog antireflection coatings made through vacuum deposition of inorganic stacks with the last layer containing a mixture of inorganic silica, alumina and an organic compound having a hydrophilic group.

However, it is very difficult in practice to accurately control the deposition of the organic/inorganic hybrid layer in the desired ratios due to the concomitant evaporation of an organic material and an inorganic material. This process is difficult to use on an industrial scale.

Besides, the corresponding coatings become foggy upon rubbing.

In WO 2007/098843 and EP 1 987 378 there is disclosed a new concept for creating an antifog antireflection coating which comprises forming blind holes from the top of an antireflection layer to a water absorbing layer. The problem is that it is very difficult to make such small and uniform blind holes without impairing the optical and mechanical properties of the coating surface.

In WO 2007/056427, WO 2008/021817, US2008/0038458 there are disclosed superhydrophilic coatings formed from layer-by-layer (LbL) assembled films including nanoparticles and/or polyelectrolytes. These superhydrophilic coatings can be antifogging, antireflective or both antifogging and antireflective, especially by adjusting porosity of the coating.

The LbL coatings having antifogging and antireflective properties have generally a high porosity and a very low refractive index.

US2008/0038458 states that "a porous material can promote infiltration of water droplet into pores (to prevent fogging) and the pores can also reduce the refractive index of the coating so that it acts as an antireflecting coating".

In the above cited patent application, a typical refractive index range is disclosed for a LbL coating obtained from positively charged $TiO_2$ nanoparticles and negatively charged $SiO_2$ nanoparticles layers alternately deposited. The refractive index of the LbL made of alternately deposited charged $SiO_2/TiO_2$ layers ranges typically from 1.28 to 1.32.

In US 2007014922, the disclosed range of refractive index for PAH (poly(allylaminehydrochloride))/$SiO_2$ LbL (calcinated or not) is 1.24 to 1.32.

According to the above patent applications, an antireflective coating is obtained by depositing the LbL coating as a monolayer on a substrate.

In US patent 2009/0324910, there is disclosed a nanoporous coating including a first thickness having a first porosity and a second thickness having a second porosity.

The two porous layers of these coatings are made by a LbL process, using inorganic particles having different sizes. Differentially sized nanoparticles can pack so as to have different refractive indices.

Due to their high porosity, such antifog LbL coatings have poor mechanical properties.

Such highly porous antifog coatings show either poor adhesion, poor durability when formed on ophthalmic lenses made of organic glass or on hard coats classically formed on such ophthalmic lenses.

Further, it is usually difficult to design a durable antireflective stack having antifog properties through such a layer-by-layer process.

Sundareshan, in a thesis report entitled "influence of counter ions on antifogging coatings" having a "library" date Jun. 18, 2008, available on the MIT website, has studied the influence of counterions on $ApSiO_2$/PAA LbL systems (Ap-$SiO_2$ designates aminopropyl functionalized silica and PAA designates poly(acrylic acid)).

Indeed, such systems do not have yet sufficient long-lasting antifog properties.

The refractive index of a 114 to 129 nm thickness $ApSiO_2$/PAA coatings has been modified by treating them with salt solutions of monovalent and divalent cations, namely sodium, lithium, potassium, calcium and barium salts.

The refractive indices of the $ApSiO_2$/PAA coatings are decreased from 1.43 (unaltered LbL coating) to around 1.34-1.35 by the treatment with monovalent cations ($Na^+$, $Li^+$, $K^+$) and were increased to 1.47-1.50 by the treatment with divalent cations ($Ca^{2+}$, $Ba^{2+}$).

Sundareshan suggested that the divalent cations may provide a source of internal crosslinking between $NH_2$ and COOH groups, which can enhance the mechanical stability of the obtained $ApSiO_2$/PAA LbL coatings.

Sundareshan noticed, however, that the treatment with such divalent cations, promoting crosslinking, decreases the hydrophilic properties and antifog properties compared to the initial non treated $ApSiO_2$/PAA coatings.

There is still a need to provide novel antireflective coatings having antifog properties and having at the same time very good antireflective properties and mechanical properties versus the highly porous monolayered or bilayered AR LbL coatings of the prior art.

It is also desirable to provide a process for obtaining said antireflecting coating having antifog properties which involves only slight modifications of processes that are currently and widely used to make AR coatings in the field of ophthalmic lenses.

SUMMARY OF THE INVENTION

An object of the invention is to provide a multilayered antireflective coating having antifog properties along with good mechanical properties.

Another object of the invention is to provide an antireflective anti-fog multilayered coating able to withstand dry wiping.

A further object of the invention is to provide a process for making a multilayered antireflective coating having antifog properties as above without requiring a calcination step.

The optical articles of the invention show low reflection, good antifog properties and good mechanical durability.

Therefore, according to the present invention, there is provided an optical article, in particular an ophthalmic lens such as a spectacle eyeglass, comprising a substrate and on at least one face of the substrate a multilayered antireflecting coating functioning in an interferential manner, having antifog properties, said antireflecting coating including a last layer with a refractive index n≤1.55 and a physical thickness of 120 nm or less directly deposited on a high refractive index layer (HI layer) having a refractive index n>1.55 and a thickness of less than 500 nm, wherein:

the last layer comprises a layer-by-layer (LbL) coating exposed to environment,
the LbL coating consists in at least two bilayers, each bilayer being formed by successively
(a) applying a first layer composition comprising at least one compound A having a first electrical charge;
(b) applying a second layer composition directly on the first layer resulting from step (a), said second layer composition comprising at least one compound B having a second electric charge which is opposite to said first electric charge;
compounds A and B being independently chosen from superabsorbent polyelectrolytes, colloids of nanoparticles of metal oxide or silicon oxide, or mixtures thereof, said nanoparticles comprising ionic groups and said compounds A and B being functionalized by either —NH$_2$ or —COOH functional groups, with the first proviso that at least one of compounds A or B is a superabsorbent polyelectrolyte, and with the second proviso that the layers of the antireflecting coating other than the last layer do not comprise any bilayer formed from compositions having opposite electrical charges, and
the LbL coating is crosslinked through chemical linkages between said —NH$_2$ and —COOH groups and has a refractive index at 643 nm ranging from 1.40 to 1.50, preferably from more than 1.43 to 1.49.

In one embodiment of the present invention, the last layer of the antireflective coating consists exclusively in a LbL coating.

In the other embodiment of the present invention, the last layer of the antireflective coating is a composite layer comprising a metal oxide or silicon oxide layer having a refractive index n≤1.55 and preferably ranging from 1.40 to 1.50, underlying a LbL layer as defined above.

The present invention also concerns a process for making a multilayered antifogging antireflecting coating functioning in an interferential manner onto an optical substrate comprising:

(i) providing an uncoated or coated substrate;
(ii) forming on said substrate at least one high refractive index layer (HI layer) having a refractive index n>1.55 and a thickness lower than 500 nm;
(iii) forming on the HI layer resulting from step (ii) a last layer with a refractive index n≤1.55 and a physical thickness of 120 nm or less comprising a LbL coating which comprises at least two bilayers, each bilayer being formed by:
(a) applying a first layer composition comprising at least one compound A having a first electrical charge;
(b) applying a second layer composition directly on the first layer resulting from step (a), said second layer composition comprising at least one compound B having a second electric charge which is opposite to said first electric charge;
compounds A and B being independently chosen from superabsorbent polyelectrolytes, colloids of nanoparticles of metal oxide or silicon oxide, or mixtures thereof, said nanoparticles comprising ionic groups and said compounds A and B being functionalized by either NH2 or COOH groups with the proviso that at least one of compounds A or B is a superabsorbent polyelectrolyte,
(c) repeating at least once steps (a) and (b),
(d) at least partially drying the LbL coating resulting from step c) and
(e) crosslinking the first and second layers of the bilayers of the LbL coating by treatment with a coupling agent in an aqueous based solvent inducing chemical linkages between said NH2 and COOH groups of compounds A and B, said crosslinking step being performed after step (d), so that the resulting LbL coating has a refractive index at 643 nm ranging from 1.40 to 1.50.

In a further embodiment of the invention, the process for making an antireflective and antifog coating comprises applying metal oxide or silicon oxide to form a low refractive index layer (LI layer) having a refractive index n<1.55 on the high refractive index layer prior to forming the LbL layer.

In general, and preferably the metal oxide and silicon oxide layers are deposited by vacuum deposition and the LbL layers are deposited by dip coating or spin coating, preferably by dip coating.

BRIEF DESCRIPTION OF THE DRAWINGS

The foregoing and other objects, features and advantages of the present invention will become readily apparent to those skilled in the art from a reading of the detailed description hereafter when considered in conjunction with the accompanying figures, wherein.

DETAILED DESCRIPTION OF THE INVENTION AND PREFERRED EMBODIMENTS

Figure 1A:
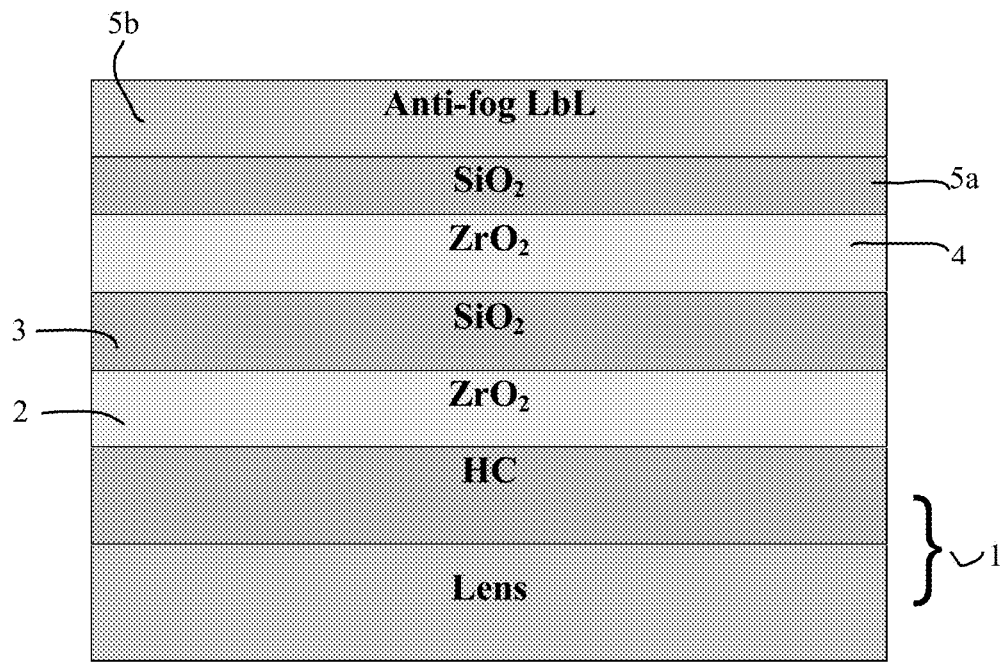
FIGS. 1A, 1B and 1C schematically represent hard coated lenses provided with different designs of an antifog antireflecting coating according to the invention.

The terms "comprise" (and any grammatical variation thereof, such as "comprises" and "comprising"), "have" (and any grammatical variation thereof, such as "has" and "having"), "contain" (and any grammatical variation thereof, such as "contains" and "containing"), and "include" (and any grammatical variation thereof, such as "includes" and "including") are open-ended linking verbs. They are used to specify the presence of stated features, integers, steps or components or groups thereof, but do not preclude the presence or addition of one or more other features, integers, steps or components or groups thereof. As a result, a method, or a step in a method, that "comprises," "has," "contains," or "includes" one or more steps or elements possesses those one or more steps or elements, but is not limited to possessing only those one or more steps or elements.

Unless otherwise indicated, all numbers or expressions referring to quantities of ingredients, ranges, reaction conditions, etc. used herein are to be understood as modified in all instances by the term "about."

When an optical article comprises one or more surface coatings, the phrase "to deposit a coating or layer onto the optical article" means that a coating or layer is deposited onto the outermost coating of the optical article, i.e. the coating which is the closest to the air.

A coating that is "on" a side of a lens is defined as a coating that (a) is positioned over that side, (b) is not necessary (but preferably) in contact with that side, i.e., one or more intervening coatings may be disposed between that side and the coating in question, and (c) does not need to cover that side completely.

As used herein, the phrase "last layer" means a monolayer or a multilayer which is in contact with the environmental air.

The phrase "functioning" in an interferential manner intends to exclude the case wherein the antireflective effect is principally due to an index gradient of the LbL layer, i.e. the case wherein the LbL layer is antireflective by itself.

Even if the presence of a gradient cannot be fully excluded, the invention uses the refractive index of the LbL and its thickness in the interferential system constituted by the multilayered antireflective coating.

In a preferential embodiment, there is no refractive index gradient inside the LbL layer.

The optical article prepared according to the present invention is a transparent optical article, preferably a lens or lens blank, and more preferably an ophthalmic lens or lens blank. The optical article may be coated on its convex main side (front side), concave main side (back side), or both sides using the process of the invention.

Herein, the term "lens" means an organic or inorganic glass lens, comprising a lens substrate which may be coated with one or more coatings of various natures.

The lens substrate may be made of mineral glass or organic glass, preferably organic glass. The organic glasses can be either thermoplastic materials such as polycarbonates and thermoplastic polyurethanes or thermosetting (cross-linked) materials such as diethylene glycol bis(allylcarbonate) polymers and copolymers (in particular CR-39® from PPG Industries), thermosetting polyurethanes, polythiourethanes, polyepoxides, polyepisulfides, poly(meth)acrylates and copolymers based substrates, such as substrates comprising (meth)acrylic polymers and copolymers derived from bisphenol-A, polythio(meth)acrylates, as well as copolymers thereof and blends thereof. Preferred materials for the lens substrate are polycarbonates (PC) and diethylene glycol bis (allylcarbonate) polymers, in particular substrates made of polycarbonate.

The surface of the article onto which the antifog antireflecting coating will be applied may optionally be subjected to a pre-treatment step intended to improve adhesion, for example a high-frequency discharge plasma treatment, a glow discharge plasma treatment, a corona treatment, an electron beam treatment, an ion beam treatment, an acid or base treatment.

The antifog antireflecting coating of the invention may be deposited onto a naked substrate or onto the outermost coating layer of the substrate if the substrate is coated with at least one surface coating. Said at least one surface coating may be, without limitation, an impact-resistant coating (impact resistant primer), an abrasion and/or scratch resistant coating, a polarized coating, a photochromic coating or a dyed coating.

The impact-resistant coating which may be used in the present invention can be any coating typically used for improving impact resistance of a finished optical article. This coating generally enhances adhesion of the abrasion and/or scratch-resistant coating on the substrate of the finished optical article. By definition, an impact-resistant primer coating is a coating which improves the impact resistance of the finished optical article as compared with the same optical article but without the impact-resistant primer coating.

Typical impact-resistance primer coatings are (meth) acrylic based coatings and polyurethane based coatings, in particular coatings made from a latex composition such as a poly(meth)acrylic latex, a polyurethane latex or a polyester latex.

Polyurethane-polyester latexes are commercially available from ZENECA RESINS under the trade name Neorez® (e.g., Neorez® R-962, Neorez® R-972, Neorez® R-986, Neorez® R-9603) or BAXENDEN CHEMICALS, a subsidiary of WITCO Corporation, under the trade name Witcobond® (e.g., Witcobond® 232, Witcobond® 234, Witcobond® 240, Witcobond® 242).

The abrasion- and/or scratch-resistant coating which may be used in the present invention can be any coating typically used for improving abrasion- and/or scratch-resistance of a finished optical article as compared to a same optical article but without the abrasion- and/or scratch-resistant coating.

Preferred abrasion- and/or scratch-resistant coatings are (meth)acrylate based coatings and silicon-containing coatings, more specifically coatings based on a hydrolyzate of epoxypolyalkoxysilanes. The latter are more preferred and some of them are disclosed, for example, in French patent application FR 2702486, which is incorporated herein by reference.

The antifog antireflective coating of the invention comprises, starting from the naked or coated substrate, at least one high refractive index layer (Hi layer) having a refractive index $n > 1.55$, preferably a stack of high refractive index layers and low refractive index layers (LI layers) of refractive index $n \leq 1.55$ and a last layer, directly formed on a HI layer which comprises a LbL layer exposed to environment (air).

The layers of the antireflecting coating other than the last layer do not comprise any bilayer formed from compositions having opposite electrical charges.

The refractive indices are measured by infrared ellipsometer at 634 nm. This method is disclosed in A. BRUNET-BRUNEAU, S. FISSON, G. VUYE, J. RIVORY, J. Appl. Phys. 2000, 87, 7303-7309, and A. BRUNET-BRUNEAU, S. FISSON, B. GALLAS, G. VUYE, J. RIVORY, Thin Solid Films, 2000, 377, 57-61.

As used herein, a low refractive index layer is intended to mean a layer with a refractive index n of 1.55 or less, preferably lower than 1.50 and even better lower than 1.45 and preferably ranging from 1.40 to 1.50, and a high refractive index layer is intended to mean a layer with a refractive index n higher than 1.55, preferably higher than 1.6, more preferably higher than 1.8 and even better higher than 2.

HI layers are classical high refractive index layers and may comprise, without limitation, one or more mineral oxides such as $TiO_2$, $PrTiO_3$, $LaTiO_3$, $ZrO_2$, $Ta_2O_5$, $Y_2O_3$, $Ce_2O_3$, $La_2O_3$, $Dy_2O_5$, $Nd_2O_5$, $HfO_2$, $Sc_2O_3$, $Pr_2O_3$ or $Al_2O_3$, or $Si_3N_4$, as well as mixtures thereof, preferably $ZrO_2$, $TiO_2$ or $PrTiO_3$. HI layers may optionally contain low refractive index materials such as $SiO_2$. Obviously, mixtures of those compounds are such that the refractive index of the resulting layer is as defined above (higher than 1.55).

LI layers are also well known and may comprise, without limitation, $SiO_2$, $SiO_x$ with $1 \leq x < 2$, $MgF_2$, $ZrF_4$, $Al_2O_3$, $AlF_3$, chiolite ($Na_5Al_3F_{14}$), cryolite ($Na_3AlF_6$), or mixtures thereof, preferably $SiO_2$ or $SiO_2$ doped with $Al_2O_3$ which contributes to raising the critical temperature of the stack. Obviously, mixtures of those compounds are such that the refractive index of the resulting layer is as defined above (lower than or equal to 1.55). When $SiO_2/Al_2O_3$ mixtures are used, the LI layer preferably contains from 1 to 10%, more preferably from 1 to 8% by weight of $Al_2O_3$ relative to the total weight of $SiO_2+Al_2O_3$ in said layer. A too high amount of alumina is detrimental to the adhesion of the AR coating.

For example, $SiO_2$ doped with 4% or less $Al_2O_3$ by weight, or $SiO_2$ doped with 8% $Al_2O_3$ by weight may be employed. Commercially available $SiO_2/Al_2O_3$ mixtures can also be employed, such as LIMA® supplied by Umicore Materials AG (refractive index n=~1.48 at 550 nm), or substance L5® supplied by Merck KGaA (refractive index n=1.48 at 500 nm). The most preferred material for LI layers is $SiO_2$ doped with 8% $Al_2O_3$ by weight.

Generally, HI layers and LI layers, have a physical thickness, ranging from 10 to 120 nm (HI) and 10 to 100 nm (LI), respectively.

The antireflecting stack of the present invention may include any layer or stack of layers which improves the anti-reflective properties of the finished optical article over at least one portion of the visible spectrum, thereby increasing the transmission of light and reducing surface reflectance.

Preferably, the multilayered antireflecting stack comprises, in addition to the innermost and outermost layers, at least one LI layer and at least two HI layers. Preferably, the total number of layers in the anti-reflection coating is ≤9, preferably ≤7.

LI and HI layers are not necessarily alternated in the AR stack, although the anti-reflection coating may comprise an alternated stack of low refractive index and high refractive index layers according to a particular embodiment of the invention. Two or more HI layers may be deposited on one another; two or more LI layers may be deposited on one another.

In general, the total thickness of the antireflecting stack is less than 1.5 μm, preferably 1 μm or less, and even better 0.5 μm or less, and generally ranging from 0.2 to 0.5 μm.

The HI and LI layers are generally applied by vacuum deposition according to one of the following techniques:
1)—by evaporation, optionally ion beam-assisted;
2)—by spraying using an ion beam,
3)—by cathode sputtering; or
4)—by plasma-assisted vapor-phase chemical deposition.

These different methods are described in "Thin Film Processes" and "Thin Film Processes II", Vossen & Kern, Ed., Academic Press, 1978 and 1981, respectively. Said evaporation under vacuum is a particularly recommended method.

These layers can also be applied by applying liquid solutions, preferably by a spin coating process. However, the layers of the antireflecting coating other than the last layer do not comprise any bilayer formed from compositions having opposite electrical charges. Preferably, such solutions do not contain superabsorbent polymers.

All antireflecting coating layers, except the final LbL coating, are preferably deposited by evaporation under vacuum.

It is well known that optical articles tend to become charged with static electricity, particularly when being cleaned under dry conditions by rubbing their surface with a cloth, a piece of synthetic foam or polyester. They can then draw and fix the small particles in their vicinity such as dusts, and this goes on for all the time the charge remains on the article. It is well known in the state of the art that an article may acquire antistatic properties thanks to the presence on its surface of an electrically conductive layer. This method has been applied in patent application WO 01/55752 and in patent EP 0834092.

An article is said to be "antistatic" when it does possess the ability not to retain and/or develop an appreciable electrostatic charge. An article is typically considered as having acceptable antistatic properties when it does not draw and fix dust as well as small particles after one of its surfaces was rubbed by means of a suitable cloth.

There are various methods for quantifying the antistatic properties of a material.

One of such methods does take the static potential of a material into account. When the material's static potential (as measured when the article is still uncharged) is 0 KV+/−0.1 KV (absolute value), the material is said to be antistatic, on the contrary when its static potential is different from 0 KV+/−0.1 KV (absolute value), the material is said to be static.

According to another method, the ability for a glass to discharge a static charge after rubbing with a cloth or by any other means suitable for generating an electrostatic charge (corona-applied charge) may be quantified by measuring the dissipation time of said charge. Thus, antistatic glasses do have a discharge time that is about a hundred milliseconds, while it is about several tens of seconds for a static glass.

The article of the invention may be made antistatic by incorporating at least one electrically conductive layer into the antireflecting stack. The electrically conductive layer may be located in various locations of the antireflecting stack, provided its antireflection properties are not impaired. It is preferably located under a low refractive index layer of the antireflecting stack.

The electrically conductive layer must be thin enough not to impair the transparency of the antireflection coating. Typically, its thickness does vary from 0.1 to 150 nm, more preferably from 0.1 to 50 nm, depending on its nature. When it is less than 0.1 nm thick, it does not typically enable to obtain a sufficient electrical conductivity, on the contrary when it is more than 150 nm thick, it does not typically enable to obtain the required transparency and low absorption characteristics.

The electrically conductive layer is preferably made of an electrically conductive and highly transparent material. In that case, its thickness does preferably vary from 0.1 to 30 nm, more preferably from 1 to 20 nm and even more preferably from 1 to 10 nm. The electrically conductive layer preferably comprises a metal oxide selected from indium, tin, and zinc oxide, as well as mixtures thereof. Indium-tin oxide ($In_2O_3$:Sn, i.e. indium oxide doped with tin) and tin oxide are preferred. According to an optimal embodiment, the electrically conductive and optically transparent layer is an indium-tin oxide layer, referred to an ITO layer.

Typically, the electrically conductive layer does contribute to obtain the antireflection properties and form a high refractive index layer in the antireflection coating. That is the case when layers are made of an electrically conductive and highly transparent material such as the ITO layers.

The electrically conductive layer may also be a layer made of a very thin noble metal that is typically less than 1 nm thick, more preferably less than 0.5 nm thick.

The electrically conductive layer, that is typically a high refractive index layer of the antireflection stack, may be deposited according to any suitable method, for example by vacuum deposition, by evaporation, preferably by ion beam assisted deposition (IAD), or by a cathode sputtering or ion beam method.

The last layer of the multilayered antifog antireflective coating of the invention comprises a LbL coating which is in direct contact with the environmental atmosphere (usually air).

The LbL coating comprises at least two bilayers, each bilayer being formed by successively
(a) applying a first layer composition comprising at least one compound A having a first electrical charge;
(b) applying a second layer composition directly on the first layer resulting from step (a), said second layer composition comprising at least one compound B having a second electric charge which is opposite to said first electric charge, said compounds A and B being independently chosen from superabsorbent polyelectrolytes, colloids of nanoparticles of metal oxide or silicon oxide, or mixtures thereof, said nanoparticles comprising ionic groups and said compounds A and B being functionalized by either $—NH_2$ or $—COOH$ functional groups, with the first proviso that at least one of compounds A or B is a superabsorbent polyelectrolyte, and with the second proviso that the layers of the antireflecting coating other than the last layer do not comprise any bilayer formed from compositions having opposite electrical charges, and the LbL coating is crosslinked through chemical linkages between said $NH_2$ and COOH groups and has a refractive index at 643 nm ranging from 1.40 to 1.50

A superabsorbent polyelectrolyte is a superabsorbent polymer having a substantial portion of its repeating units bearing an electrolyte group. These groups are ionic or ionisable groups especially in aqueous based solutions.

A superabsorbent polymer is a polymer forming a hydrophilic network that can absorb and retain a high amount of water, i.e. more than 100% by weight of water.

Typically, superabsorbent polymers can imbibe deionized water as high as 1,000 to 100,000% by weight (10 to 1000 g/g).

Examples of superabsorbent polymers are poly(acrylic acid), carbohydrate polymers (polysaccharides) such as chitosan or cellulose.

According to the invention, the superabsorbent polyelectrolyte comprises free amino or acidic groups.

Preferably, the superabsorbent polyelectrolyte is a polysaccharide polymer including glucosamine units, a carboxyalkyl cellulose polymer or a polyacrylic acid polymer or polyacrylic acid copolymer.

In a preferred embodiment, the LbL coating of the invention comprises at least two bilayers, each bilayer being enabled by the molecular level blending of at least two superabsorbent polyelectrolytes which are crosslinked through chemical bondings between $—NH_2$ groups and $—COOH$ groups.

In another embodiment of the present invention, compound A or B comprises silicon oxide nanoparticles, preferably functionalized with amino groups.

In the present invention each bilayer of the LbL coating preferably consists in:
a) a first layer of a polysaccharide comprising glucosamine units such as chitosan (CTS) or poly(1,3-β-D-glucosamine-alt-1,4-β-D-glucuronic acid), preferably chitosan, and a second layer of a carboxyalkyl cellulose, such as carboxymethyl cellulose, carboxyethyl cellulose or carboxypropyl cellulose, preferably carboxymethyl cellulose (CMC); or
b) a first layer of an oxide of a metal or silicon which is surface functionalized with amine groups, preferably aminopropyl functionalized silica nanoparticles (Ap-SiO$_2$), and a second layer of a polymer chosen from PAA, poly(methacrylic acid) (PMAA), PAA copolymer, PMAA copolymer and mixtures thereof, preferably PAA.

The LbL coating application process involves the sequential dipping, spraying or spin-coating of solutions of the specific constituents. The deposition of each cycle of complementary polymers creates a "bilayer".

For convenience in expressing the assembled system, the following notation is commonly used: (polycation/polyanion)$_n$. Polycation and polyanion are the abbreviations of the specific polyelectrolytes used in the LbL assembly and n is the number of bilayers that have been deposited. For example, a ten bilayer assembly comprising CTS and CMC is noted as $(CTS/CMC)_{10}$. Sometimes the LbL coating may comprise one additional layer of one of the above disclosed constituents. Therefore, for example a LbL assembly of ten bilayers of CTS and CMC including one additional CTS layer is noted $(CTS/CMC)_{10.5}$.

Although the LbL coating may comprise 2 to 20 bilayers, it preferably comprises 8 to 15 bilayers and more preferably 8 to 12 bilayers.

Typically the LbL coating will have a physical thickness ranging from 30 to 120 nm, preferably from 60 to 100 nm.

The LbL coating, after the crosslinking step, has a refractive index n ranging from 1.40 to 1.50, preferably from 1.43 to 1.49.

As indicated the LbL coating is crosslinked through bondings between $NH_2$ and COOH groups.

Before the crosslinking step, the LbL coating is at least partially dried, preferably in the air, at ambient temperature during typically 5 minutes to 1 hour, preferably 10 to 20 minutes.

Then the crosslinking step is classically performed by treatment with a coupling agent inducing chemical bonds between $NH_2$ and COOH groups. Carbodiimide coupling reagents are well known for the formation of amide linkages. Useful carbodiimide-functional compounds have formula:

$N(CH_3)_2—(CH_2)_n—N=C=N—CH_2CH_3$, wherein n is an integer from 2 to 6. Particularly, preferred compound is the compound with n=3, 1-ethyl-3-(-3-dimethylaminopropyl) carbodiimide (EDC). EDC is commercially available from TCI America. Other useful carbodiimides are N,N'-dicyclohexylcarbodiimide and N,N'-diisopropylcarbodiimide.

These carbodiimides are often used in combination with hydroxysuccinimide, sulfo-hydroxysuccinimide or N-hydroxybenzotriazole to increase coupling efficiency and decrease side reactions.

Synthesis of carbodiimides are disclosed by Sheehan, John; Cruishank, Philip, Boshart, Gregory (1961) in "A convenient Synthesis of Water soluble Carbodiimides" J. Org. Chem. 26 (7), 2525 and by Nakajima, N; Ikada, Y (1995) in "Mechanism of Amide Formation by Carbodiimide for Bioconjugation in Aqueous Media" Bioconjugate Chem., 6 (1), 123.

A preferred coupling agent is 1-ethyl-3-[3-dimethylaminopropyl]carbodiimide (EDC), combined with N-hydroxysuccinimide (NHS) in a buffered solution.

The process of the invention does not require any calcination step to get the advantageous properties of the final AR coating.

All the process steps are implemented at a temperature lower than 130° C., preferably lower than 100° C. More preferably, all the process steps are implemented at a temperature lower than 50° C. and better at ambient temperature.

According to the process of the invention, it is possible to accurately control the refractive index of the LbL coating comprising a superabsorbent polymer by controlling the degree of swelling of the resulting LbL coating, i.e. controlling its porosity.

As explained previously, superabsorbent polymers have a huge ability to swell in water. It is an important feature of the invention to limit the increase of porosity of the final LbL coating. It is possible to obtain a final refractive index close to the refractive index of silica, classically used in the common evaporated antireflective stacks.

There is consequently no need to substantially modify usual AR stacks when using the process of the invention.

Obviously, the process of the invention can also be used with new designed AR stacks.

The swelling of the superabsorbent polymer, and consequently the porosity of the final LbL coating, is limited by the crosslinking step of the LbL coating.

This control may also be achieved by adding an organic cosolvent such as an alcohol to the aqueous based solution used for the crosslinking step.

It was experimentally found that the refractive index of the final LbL coating in its crosslinked state increases when the ratio of organic solvent/water in the crosslinking solution increases.

The last layer of the antifog antireflecting coating of the invention can be entirely formed of a LbL coating as disclosed above or it can also be a composite layer consisting of LbL coating as above and an underlayer (between the LbL coating and a HI layer of the antifog antireflecting coating) having a refractive index n≤1.55 comprising and preferably made of metal oxide or silicon oxide, preferably $SiO_2$. This underlayer generally has a physical thickness of 10 to 50 nm, preferably 10 to 30 nm, and better 10 to 20 nm. The underlayer is applied by the same processes as the usual HI and LI layers made of metal oxide and silicon oxide disclosed above. The underlayer is preferably applied by vacuum deposition.

The antifog antireflecting coating of the invention presents a good adhesion to the substrate and advantageously can withstand dry wiping without losing its antifog properties.

The present invention will now be described with reference to the following examples.

EXAMPLES

1. Testing Methods

The following test procedures were used to evaluate the optical articles according to the present invention.

(a) Fog Test According to EN 168 Standard

The antifog properties were evaluated by an apparatus slightly modified from European Standard Test (EN 168). The ambient temperature during the measurement is 23±5° C. The temperature of the water bath is set at 50±0.5° C. The air above the water bath is circulated using a ventilator, so that it becomes saturated with water vapor. During this time, the measurement opening is to be covered. The ventilator is switched off before measurement. The samples must be placed in the test position within 2 s of the opening being uncovered.

To measure the transmittance change, the sample is placed on the seating ring, with one side exposed to the water vapor and the upper side exposed to the air. The relative transmittance ($T_r$) is recorded as $T_r\% = (T_f/T_i)*100 = (I_f/I_i)*100$, where the initial transmittance ($T_i$) is determined by laser intensity ($I_i$) passing through the sample in the non-fogging conditions, and the transmittance ($T_f$) is determined by laser intensity ($I_f$) passing through the sample during the fogging condition. The measurement spectrum shows the change of $T_r$ during a measurement time from 0 to 120 s. An Essilor reference (Ref.) lens is used as a comparison example (5% $T_r$ at 60 s and 7% at 120 s). Two $T_r$ data at 60 s and 120 s of each sample are listed in the table for sample comparison.

The Ref. lens is a lens comprising a substrate as defined below in point "preparation of the substrate" on which have been formed by vacuum deposition, starting from the substrate, an antireflective stack comprising a first layer $ZrO_2$ (27 nm), a second layer $SiO_2$ (21 nm), a third layer $ZrO_2$ (80 nm), a fourth layer $SiO_2$ (81 nm) layer, and, on top of the antireflective stack, an antisoiling coating by evaporation under vacuum of OPTOOL DSX® marketed by DAIKIN INDUSTRIES (thickness: from 2 to 5 nm).

(b) Hand Wiping Test

A coated substrate is hand-wiped with a dry microfiber cloth for 20 strokes (one stroke: one back and one forth actions). After wiping, the coated substrate is under visual inspection by two levels: 1) passed: if the coating remains the initial antireflecting color and no fog by breathing; 2) failed: if the coating loses the initial antireflecting color and appears foggy by breathing, indicating the coatings partially or completely removed.

(c) Reflectance

The mean reflectance factor Rv is such as defined in ISO standard 13666:1998 and measured in accordance with ISO standard 8980-4, i.e. it is the balanced average spectral reflection in the visible spectrum in the wavelengths limits ranging from 380 nm to 780 nm. An AR coating provides à Rv of less than 2.5% per face of a coated lens.

The mean reflectance Rm is the mean value (not balanced) of the spectral reflectance over a wavelength range 400 nm to 700 nm.

(d) Thickness

The thickness of the layers and films prepared on frosted glass is evaluated by infrared ellipsometer at 634 nm (thickness<1 μm) equipped with M-44™, EC-270 and LPS-400 with 75 W Xenon light source from J.A. Woolam Co. Inc.; or the thickness of the layers and films coated on lenses is measured by a Metricon Model 2010 Prism Coupler apparatus (thickness >1 μm) from Metwicon Corporation.

2. Preparation of the Substrate

In all examples the optical articles were round lenses (piano or −2.00 dioptres with a diameter of 68 mm) comprising an ORMA® lens substrate (obtained by polymerizing CR-39® diethylene glycol bis(allyl carbonate) monomer), coated on both faces with an abrasion-resistant and/or an antiscratch coating (hard coat) disclosed in example 3 of the patent EP 0614957 (refractive index 1.50, thickness 3.5 μm), based on a hydrolysate of GLYMO and DMDES, with colloidal silica and aluminum acetyl acetonate.

The abrasion-resistant coating was obtained by depositing and curing of a composition comprising by weight, 224 parts of GLYMO, 80.5 parts of HCl 0.1 N, 120 parts of DMDES, 718 parts of a 30 weight % colloidal silica in methanol, 15 parts of aluminum acetyl acetonate and 44 parts of ethylcellulose. The composition also comprised 0.1% of the surfactant FLUORAD™ FC-430® (3M) by weight as related to the total weight of the composition. This abrasion-resistant coating was deposited directly onto the substrate.

3. Antifog Antireflecting Coating Designs

Three designs of antifog antireflecting coatings have been elaborated using classical software of AR modelization.

All the thicknesses of the different layers of the AR coatings have been determined assuming a theoretical refractive index for the last LbL layer (refractive index considered as 1.48 (design III) or 1.50 (design I and II) at 634 nm).

In the tables under 3.1 to 3.3 hereafter, there are reported the thicknesses actually (experimentally) deposited for the vacuum deposited layers and the LbL layers deposited by dip coating.

The layers deposited by vacuum deposition strictly correspond to the modelized layer.

The experimentally deposited LbL layers have a thickness and a refractive index slightly different from the theoretically required values.

However, as this will be demonstrated hereafter, the obtained lenses have very good AR properties.

3.1. Design I (FIG. 1A)

Both sides of a substrate 1 as disclosed in point 2 above were coated from bottom to top by vacuum deposition with layers 2 to 5a and by dip coating with a final LbL coating 5b.

| Layer | | Material | Thickness (nm) |
|---|---|---|---|
| 2 | | $ZrO_2$ | 26 |
| 3 | | $SiO_2$ | 22 |
| 4 | | $ZrO_2$ | 88 |
| 5 | 5a | $SiO_2$ | 13 |
| | 5b | LbL | 85-100 nm for CTS/CMC based LbL or 70-80 nm for $ApSiO_2$/PAA based LbL |

Figure 1B:
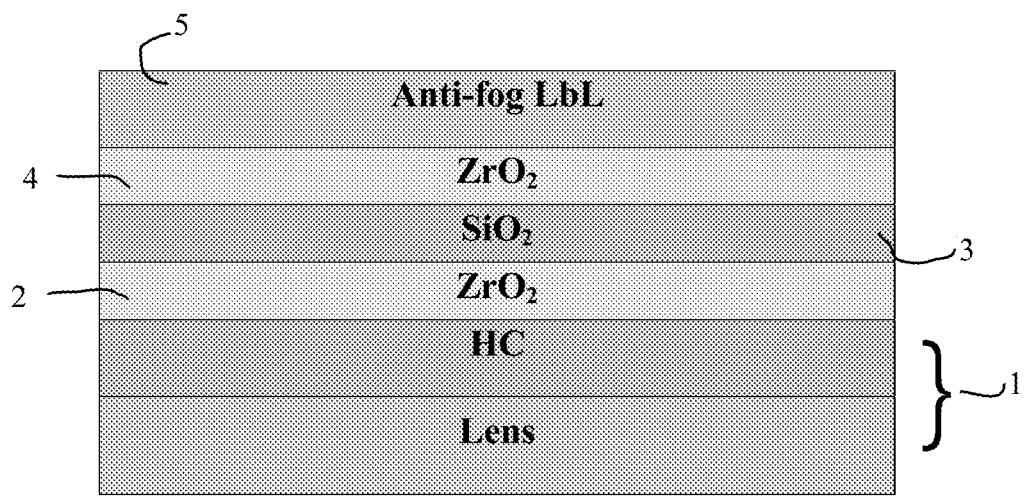

3.2. Design II (FIG. 1B)

Both sides of a substrate 1 as disclosed in point 2 above were coated from bottom to top by vacuum deposition with layers 2 to 4 and by dip coating with a final LbL coating 5:

| Layer | Material | Thickness (nm) |
|---|---|---|
| 2 | $ZrO_2$ | 26 |
| 3 | $SiO_2$ | 22 |
| 4 | $ZrO_2$ | 87 |
| 5 | LbL | 105 nm for CTS/CMC based LbL |

Figures 1, 1C:
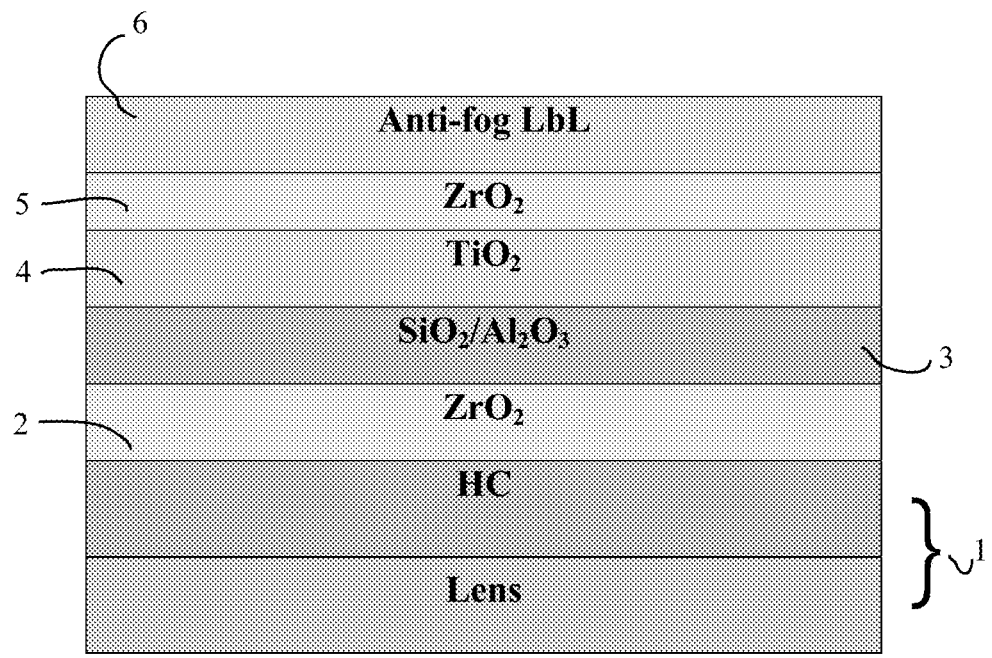

3.3. Design III (FIG. 1C)

Both sides of a substrate as disclosed in point 2 above were coated from bottom to top by vacuum deposition with layers 2 to 5 and by dip coating with LbL coating 6:

| Layer | Material | Thickness (nm) |
|---|---|---|
| 2 | $ZrO_2$ | 27 |
| 3 | $SiO_2/Al_2O_3$ | 42 |
| 4 | $TiO_2$ | 26 |
| 5 | $ZrO_2$ | 9 |
| 6 | LbL | 104 nm for $ApSiO_2$/PAA based LbL |

The solid content of $Al_2O_3$ in the layer 3 is 8 wt %.

3.4. Application of LbL Coating

Two types of layer-by-layer (LbL) coatings were applied onto these designed AR stacks.

The general process for application of LbL coating onto both sides of a substrate coated with the antireflecting mineral layers is as follows:

I. Surface cleaning: The coated substrate is first dipped in an ultrasonic caustic solution, and then rinsed in ultrasonic deionized (DI) water and air dried; or treated with air or oxygen plasma.

II. Coating process: The treated substrate is dipped in a polycation solution, followed with a rinsing step in two agitated DI water baths; and then dipped in a polyanion solution, followed with a rinsing step in two agitated DI water baths. This process is repeated for (n−1) times and the resulting coated substrate is then air dried for 20 to 30 minutes to get a coating with n bilayers of (polycation/polyanion), written as (polycation/polyanion)$_n$. In some cases, the polycation is further deposited as the outermost layer in the process, then the multilayer coating is then written as (polycation/polyanion)$_{n+0.5}$.

III. Post-treatment: After being dried as mentioned in II above, the multilayers are chemically cross-linked in a crosslinker solution, then rinsed in an ultrasonic solution and air dried.

Names and conditions of chemicals used here:

Polycations: chitosan (CTS, low molecular weight, used at 0.1 wt % in water added with 0.2 wt % of acetic acid for solubility improvement, pH=4.0) and $ApSiO_2$ nanoparticles (15 nm, 3.0 w/v % in ethanol, used at 0.005 wt % in water, pH=3.5) purchased from Sigma-Aldrich Polyanions: sodium carboxymethyl cellulose purchased from Sigma-Aldrich (CMC, Mw=250,000, used at 0.1 wt % in water, pH=4.0), polyacrylic acid purchased from Polysciences, Inc (PAA, used as 0.01M in water, pH=3.5)

Crosslinking agents: 1-Ethyl-3-[3-dimethylaminopropyl] carbodiimide hydrochloride (EDC) purchased from TCI America, N-hydroxysuccinimide (NHS) purchased from Alfa Aesar Buffer solutions: 2-(N-Morpholino)ethanesulfonic acid (MES, 0.05 M) and Phosphate buffered saline (PBS) purchased from Sigma-Aldrich Example 1

CTS/CMC Coating on Design I Stack 0.1 wt % of CTS (added with 0.2 wt % of acetic acid) and 0.1% of CMC solutions were prepared with deionized (DI) water, respectively. All solutions including the DI water rinsing baths were titrated down to pH 4.0 using 0.1N HCl. The dipping time in material solutions was 5 min. The rinsing time in both of agitated DI water was 2 min (agitation speed is about 100 rpm).

A LbL coating (CTS/CMC)$_{10}$ or (CTS/CMC)$_{11}$ was assembled on both sides of the Design I lens, dried and then dipped in a 0.05M MES buffer solution containing EDC (0.2 M) and NHS (0.05 M) for 1 h, and finally rinsed by a PBS solution (0.5×) and air dried. The refractive index of the coatings was characterized as 1.51 and 1.45 at 634 nm, respectively, before and after the crosslinking step, measured by ellipsometer. The thickness of the two LbL coatings was about 60 nm, and increased to 85-100 nm after the crosslinking step. The AR parameters of a concave side of crosslinked samples (C1-1 &2) and the coating antifog performances are shown in the table.

| Sample | Coating | Rm (%) | Rv (%) | $T_r$ % (EN168) 60 s | 120 s |
|---|---|---|---|---|---|
| C1-1 | Crosslinked (CTS/CMC)$_{10}$ | 0.34 | 0.31 | 72 | 77 |
| C1-2 | Crosslinked (CTS/CMC)$_{11}$ | 0.71 | 0.33 | 83 | 85 |

Example 2

CTS/CMC Coating on Design II Stack

The procedure was same as Example 1. A LbL coating (CTS/CMC)$_{12.5}$ was assembled on both sides of the Design II lens, dried and then dipped in a 0.05M MES buffer solution (pH=5.0), containing EDC (0.2 M) and NHS (0.05 M) for 1 h, and finally rinsed by a PBS solution (0.5×, pH=7.0) and air dried. The thickness of the crosslinked LbL coating was about 105 nm and its refractive index was 1.46 in average.

| Sample | Coating | Rm (%) | Rv (%) | $T_r$ % (EN168) 60 s | 120 s |
|---|---|---|---|---|---|
| C2-1 | Crosslinked $(CTS/CMC)_{12.5}$ | 1.37 | 0.94 | 92 | 91 |

Example 3

$ApSiO_2$/PAA Coating on Design I Stacks 0.05 wt % of $ApSiO_2$ and 0.01M of PAA solutions were prepared with DI water, respectively. All solutions including the DI water rinsing baths were titrated down to the same pH 3.5 using 0.1N HCl. The dipping time in material solutions was 2 min. The rinsing time in both of agitated DI water was 1 min (agitation speed is about 100 rpm).

The $(ApSiO_2/PAA)_8$ or $(ApSiO_2/PAA)_{8.5}$ coating was assembled on both sides of the Design I lens, dried and then dipped in a 0.05M MES buffer solution containing EDC (0.2 M) and NHS (0.05 M) for 1 h, and finally rinsed by a PBS solution (0.5×) and air dried. The thickness of two crosslinked coatings was 70-80 nm and their refractive index was 1.48 in average at 634 nm.

| Sample | Coating | Rm (%) | Rv (%) | $T_r$ % (EN168) 60 s | 120 s |
|---|---|---|---|---|---|
| C3-1 | Crosslinked $(ApSiO_2/PAA)_8$ | 0.93 | 0.81 | 70 | 68 |
| C3-2 | Crosslinked $(ApSiO_2/PAA)_{8.5}$ | 0.76 | 0.56 | 76 | 77 |

Example 4

$ApSiO_2$/PAA Coating on Design III Stack

The procedure is same as in Example 3. An $(ApSiO_2/PAA)_{11}$ coating was assembled on both sides of the Design III lens, dried and then dipped in a 0.05M MES buffer solution containing EDC (0.2 M) and NHS (0.05 M) for 1 h, and finally rinsed by a PBS solution (0.5×) and air dried. The thickness of the crosslinked coating was about 104 nm and its refractive index was 1.48.

| Sample | Coating | Rm (%) | Rv (%) | $T_r$ % (EN168) 60 s | 120 s |
|---|---|---|---|---|---|
| C4-1 | Crosslinked $(ApSiO_2/PAA)_{11}$ | 0.87 | 0.51 | 95 | 94 |

Figure 2A:
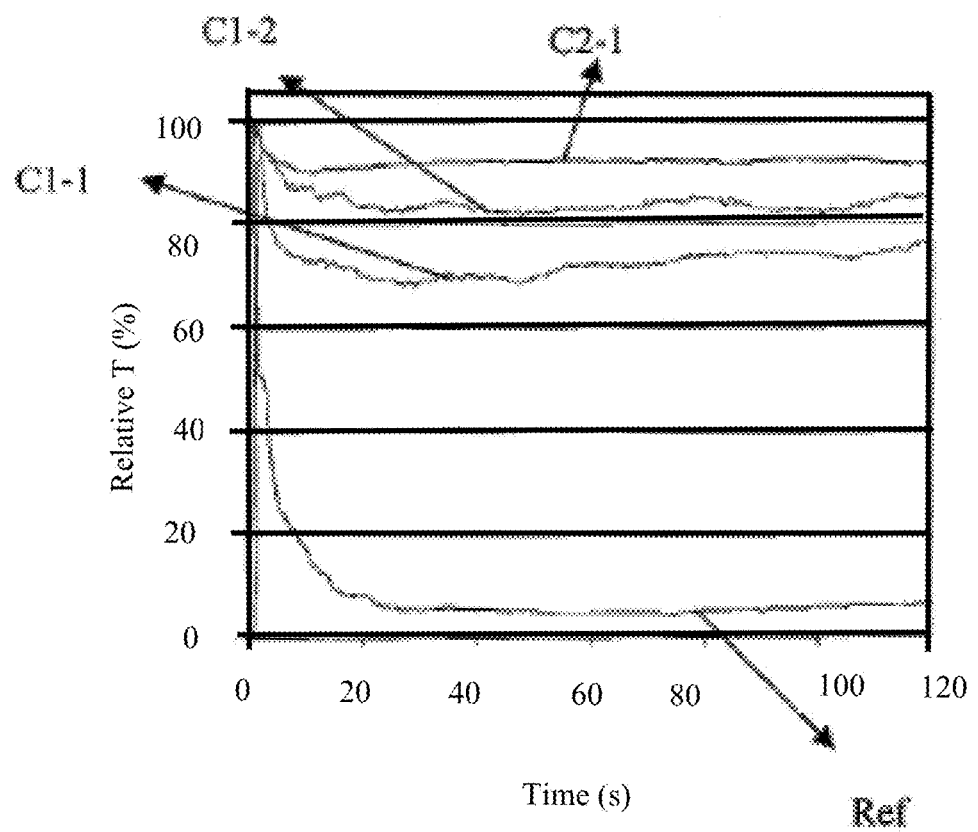
FIGS. 2A and 2B are relative transmission (Tr) graphs of different antifog antireflecting coatings, compared with an Essilor reference lens (Ref.), measured by the EN 168 Standard fog test.
Figure 2B:
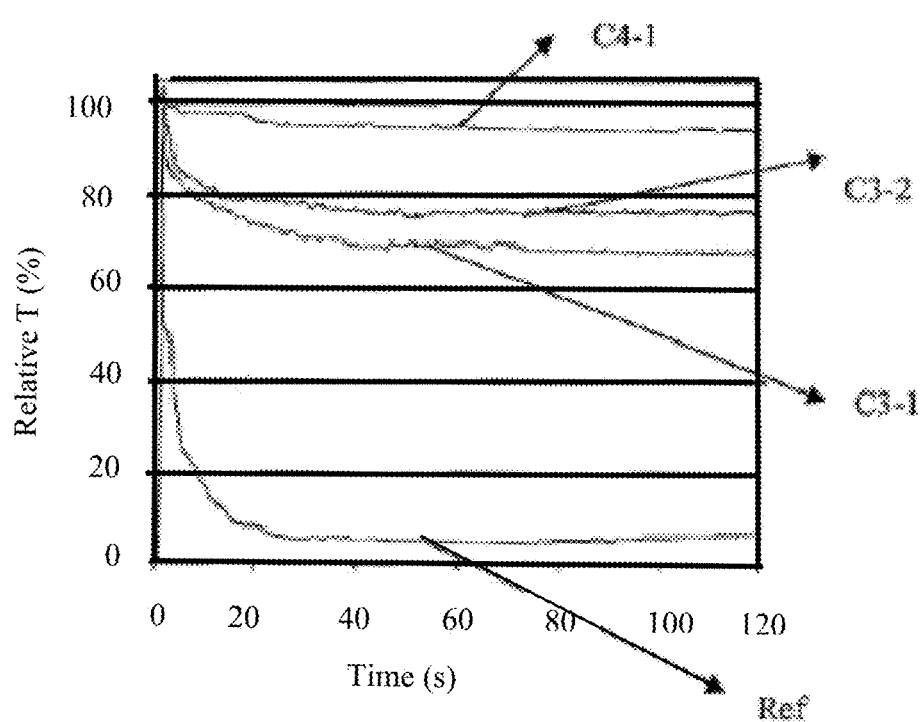

As shown by FIGS. 2A and 2B, the optical articles according to the invention have good antifog properties compared to a classical Reference lens.

Also, the optical articles according to the invention have good antireflecting properties in the visible region as demonstrated by their Rm and Rv parameter.

The Rv values for all examples of the inventions are far beneath the upper Rv limit of 2.5% per face required by the International Standard previously referred to.

Finally all the optical articles of the invention shown above successfully passed the hand wiping test.

Comparative Examples 1-3

Example 1 (AR design I), 2 (AR design II) and 4 (AR design III) were reproduced, except that a classical antifog coating Visgard™ available from Film Specialties, Inc. was used to replace the LbL coating of the invention.

The Visgard™ coating composition was diluted with solvent glycol ether PM into a solution of 2-3 wt %. The coatings were prepared by spin (800 rpm for 5 s and 1500 rpm for 8 s). The thickness was adjusted to the simulated thickness range.

The samples were then backed at 126° C. for 1 h. After cooling down, the samples were conducted the same tests shown in the previous examples.

| Sample | AR Design | Coating thickness (nm) | Rv % | $T_r$ % at 60 s (EN168) | Cosmetic | Hand wiping test |
|---|---|---|---|---|---|---|
| CE-1 | I | 72 | 0.72 | 95 | Crazed | Failed |
| CE-2 | II | 85 | 0.75 | 95 | Crazed | Failed |
| CE-3 | III | 96 | 0.85 | ~100 | Good | Failed |

In general, the lenses CE1 and CE2 appeared severely crazed under visual inspection but CE3 appeared good due to the specifically designed resistance to crazing at high temperature. All lenses showed good antifog and antireflecting performances, but failed in the hand wiping test, indicating bad mechanical properties.

Example 5

This example shows how it is possible to control the refractive index of crosslinked LbL coatings used in the invention: by modifying the solvent ratio.

Two $(CTS/CMC)_{10}$ LbL crosslinked coatings are prepared according to the protocol of example 1, except that the solvent of the crosslinking solution is a blend of $H_2O$/ethanol in different weight ratios.

The obtained thickness and indices after crosslinking are mentioned in the following table.

| $(CTS./CMC)_{10}$ | Crosslinking solvent | Thickness (nm) | Refractive Index at 634 nm |
|---|---|---|---|
| C5-1 | $H_2O$/EtOH (60:40 wt %) | 77 | 1.46 |
| C5-2 | $H_2O$/EtOH (20:80 wt %) | 61 | 1.48 |

The invention claimed is:
1. An optical article comprising a substrate and on at least one face of the substrate a multilayered antireflecting coating functioning in an interferential manner having antifog properties, said antireflecting coating providing to said face of the substrate a reflectance Rv less than 2.5%, said antireflecting coating including a last layer with a refractive index n≤1.55 and a physical thickness of 120 nm or less directly deposited on a high refractive index layer (HI layer) having a refractive index n>1.55, and a thickness of less than 500 nm, wherein:
(a) the last layer comprises a layer-by-layer (LbL) coating exposed to the environment;
(b) the LbL coating consists in multiple bilayers with at least two bilayers, each bilayer being formed by successively:
  (i) applying a first layer composition comprising at least one compound A having a first electrical charge;
  (ii) applying a second layer composition directly on the first layer resulting from step (i), said second layer composition comprising at least one compound B having a second electric charge which is opposite to said first electric charge, said compounds A and B being independently a superabsorbent polyelectrolyte, a colloid of nanoparticles of a metal oxide or a silicon oxide, or mixtures thereof, said nanoparticles comprising ionic groups; and said compounds A and B being functionalized by either $—NH_2$ or —COOH functional groups, with the first proviso that at least one of compounds A or B is a superabsorbent polyelectrolyte, and with the second proviso that the layers of the antireflecting coating other than the last layer do not comprise any bilayer formed from compositions having opposite electrical charges; and
(c) the LbL coating is cross-linked through chemical linkages between said $NH_2$ and COOH groups and has a refractive index at 643 nm of from 1.40 to 1.50.

2. The optical article of claim 1, wherein the superabsorbent polyelectrolyte is a polysaccharide polymer including glucosamine units, a carboxyalkyl cellulose polymer, or a polyacrylic acid polymer or polyacrylic acid copolymer.

3. The optical article of claim 1, wherein the silicon oxide nanoparticles are obtained from silica nanoparticles functionalized with amino groups.

4. The optical article of claim 1, wherein each bilayer of the LbL coating comprises:
(a) the first layer of a polysaccharide comprising glucosamine units and the second layer of a carboxyalkyl cellulose; or
(b) the first layer of a colloid of nanoparticles of a metal oxide or a silicon oxide which is surface functionalized with amine groups and the second layer of a polymer comprising polyacrylic acid (PAA), poly(methacrylic acid) (PMAA), PAA copolymer, and/or PMAA copolymer.

5. The optical article of claim 4, wherein each bilayer of the LbL coating consists of:
(a) the first layer of a polysaccharide comprising glucosamine units and the second layer of a carboxyalkyl cellulose; or
(b) the first layer of a colloid of nanoparticles of a metal oxide or a silicon oxide which is surface functionalized with amine groups and the second layer of a polymer comprising polyacrylic acid (PAA), poly(methacrylic acid) (PMAA), PAA copolymer, and/or PMAA copolymer.

6. The optical article of claim 4, wherein the bilayer comprises the first layer of a polysaccharide comprising glucosamine units and the second layer of a carboxyalkyl cellulose.

7. The optical article of claim 6, wherein the glucosamine units are further defined as chitosan (CTS) or poly(1,3-β-D-glucosamine-alt-1,4-β-D-glucuronic acid).

8. The optical article of claim 6, wherein the carboxyalkyl cellulose is further defined as carboxymethyl cellulose, carboxyethyl cellulose, or carboxypropyl cellulose.

9. The optical article of claim 6, wherein the first layer of the bilayer is made of chitosan and the second layer of the bilayer is made of carboxymethyl cellulose.

10. The optical article of claim 4, wherein the bilayer comprises a first layer of a colloid of nanoparticles of a metal oxide or a silicon oxide which is surface functionalized with amine groups and a second layer of a polymer comprising polyacrylic acid (PAA), poly(methacrylic acid) (PMAA), PAA copolymer, and/or PMAA copolymer.

11. The optical article of claim 10, wherein the oxide of a metal or a silicon which is surface functionalized with amine groups is aminopropyl functionalized silica nanoparticles (ApSiO2).

12. The optical article of claim 11, wherein the first layer of the bilayer is made of aminopropyl functionalized silica and the second layer of the bilayer is made of polyacrylic acid.

13. The optical article of claim 1, wherein the last layer consists entirely in a LbL coating.

14. The optical article of claim 1, wherein the last layer is a composite layer comprising a metal oxide or silicon oxide layer having a refractive index n≤1.55 underlying said LbL coating said underlying metal oxide or a silicon oxide layer has a physical thickness of from 10 to 20 nm.

15. The optical article of claim 1, wherein the LbL coating has a refractive index n of from 1.43 to 1.49.

16. The optical article of claim 1, wherein the multilayered antireflecting coating further comprises a stack of low refractive index layers (LI layers) having a refractive index n≤1.55 and high refractive index layers (HI layers) having a refractive index n>1.55.

17. The optical article of claim 16, wherein
(a) the LI layers comprise $SiO_2$, $SiO_x$ with 1≤x<2, $MgF_2$, $ZrF_4$, $AlF_3$, chiolite (Na5Al3F14), cryolite ($Na_3AlF_6$), mixtures of $SiO_2$ and/or $SiO_x$ and 10% by weight or less of Al2O3; and
(b) the HI layers comprise $ZrO_2$, $TiO_2$, $Ta_2O_5$, $Na_2O_5$, $Pr_2O_5$, $PrTiO_3$, $La_2O_3$, $Dy_2O_5$, $Nb_2O_5$, $Y_2O_3$, mixtures thereof, and/or mixtures of these oxides with silica and/or alumina.

18. The optical article of claim 16, wherein the HI and LI layers of the stack are deposited through a vacuum evaporation process.

19. The optical article of claim 1, wherein the LbL coating comprises 2 to 20 bilayers.

20. The optical article of claim 1, wherein the optical article is an ophthalmic lens.

21. A process for making the optical article of claim 1 comprising:
(a) providing an uncoated or coated optical article comprising substrate;
(b) forming on said substrate at least one high refractive index layer (HI layer) having a refractive index n>1.55 and a thickness lower than 500 nm; and
(c) forming on the HI layer resulting from step (b) a last layer with a refractive index n <1.55 and a physical thickness of 120 nm or less comprising a layer-by-layer (LbL) coating which consists in multiple bilayers with at least two bilayers, each bilayer being formed by:
  (i) applying a first layer composition comprising at least one compound A having a first electrical charge;
  (ii) applying a second layer composition directly on the first layer resulting from step (i), said second layer composition comprising at least one compound B having a second electric charge which is opposite to said first electric charge;
(d) said compounds A and B being independently chosen from superabsorbent polyelectrolytes, a colloid of nanoparticles of a metal oxide or a silicon oxide, or mixtures thereof, said nanoparticles comprising ionic groups and said compounds A and B being functionalized by either —NH2 or —COOH groups, with the first proviso that at least one of compounds A or B is a superabsorbent polyelectrolyte, and with the second proviso that the layers of the antireflecting coating other than the last layer do not comprise any bilayer formed from compositions having opposite electrical charges, and (i) repeating at least once steps (i) and (ii);
(ii) at least partially drying the LbL coating resulting from step (iii); and
(iii) crosslinking the first and second layers of the bilayers of the LbL coating by treatment with a coupling agent in an aqueous based solvent inducing chemical linkages between said —NH2 and —COOH groups of compounds A and B, said crosslinking step being performed after step (iv), so that the resulting LbL coating has a refractive index at 643 nm of from 1.40 to 1.50.

22. The process of claim 21, wherein the superabsorbent polyelectrolyte is a polysaccharide polymer including glucosamine units, a carboxyalkyl cellulose polymer, or a polyacrylic acid polymer or polyacrylic acid copolymer.

23. The process of claim 21, wherein the silicon oxide nanoparticles are obtained from silica nanoparticles functionalized with amino groups.

24. The process of claim 21, wherein each bilayer of the LbL coating comprises:
(a) the first layer of a polysaccharide comprising glucosamine units and the second layer of a carboxyalkyl cellulose; or
(b) the first layer of a colloid of nanoparticles of the metal oxide or the silicon oxide which is surface functionalized with amine groups and the second layer of a polymer comprising polyacrylic acid (PAA), poly(methacrylic acid) (PMAA), PAA copolymer, and/or PMAA copolymer.

25. The process of claim 21, wherein the last layer consists in a LbL coating.

26. The process of claim 21, wherein the last layer is a composite layer consisting in a layer comprising metal oxide or silicon oxide underlying the LbL coating and is formed by:
(a) forming the layer comprising metal oxide or silicon oxide on said HI layer; and
(b) forming the LbL coating on the layer resulting from step (a).

27. The process of claim 21, further comprising forming a stack of LI and HI layers prior to forming the last layer on a HI layer of the stack.

28. The process of claim 27, wherein:
(a) the LI layers comprise SiO2, SiOx with $1 \leq x < 2$, MgF2, ZrF4, AlF3, chiolite (Na5Al3F14), cryolite (Na3AlF6), mixtures of SiO2 and/or SiOx and 10% by weight or less of Al2O3; and
(b) the HI layers comprise ZrO2, TiO2 Ta2O5, Na2O5, Pr2O3, PrTiO3, La2O3, Dy2O5, Nb2O5, Y2O3, mixtures thereof, and/or mixtures of these oxides with silica and/or alumina.

29. The process of claim 27, wherein the HI and LI layers coating are made by vacuum deposition.

30. The process of claim 21, wherein in cross linking step (v), the coupling agent comprises a carbodiimide compound.

31. The process of claim 30, wherein the carbodiimide compound is 1-ethyl-3-[3-dimethylaminopropyl]carbodiimide hydrochloride and N-hydroxysuccinimide.

* * * * *

UNITED STATES PATENT AND TRADEMARK OFFICE
CERTIFICATE OF CORRECTION

PATENT NO.        : 8,709,582 B2
APPLICATION NO.   : 12/847810
DATED             : April 29, 2014
INVENTOR(S)       : Haipeng Zheng et al.

It is certified that error appears in the above-identified patent and that said Letters Patent is hereby corrected as shown below:

<u>Title Page, Item (73) Assignee, line 1</u>:
Remove "Essilor International," and replace with -- Essilor International (Compagnie Generale D'Optique), --.

Signed and Sealed this
Sixteenth Day of September, 2014

Michelle K. Lee
*Deputy Director of the United States Patent and Trademark Office*